(12) United States Patent
Tsai et al.

(10) Patent No.: US 10,818,819 B2
(45) Date of Patent: Oct. 27, 2020

(54) MICRO LIGHT EMITTING DEVICE AND DISPLAY APPARATUS

(71) Applicant: PixeLED Display CO., LTD., Hsinchu County (TW)

(72) Inventors: Pai-Yang Tsai, Hsinchu County (TW); Fei-Hong Chen, Hsinchu County (TW); Yi-Chun Shih, Hsinchu County (TW)

(73) Assignee: PixeLED Display CO., LTD., Hsinchu County (TW)

( * ) Notice: Subject to any disclaimer, the term of this patent is extended or adjusted under 35 U.S.C. 154(b) by 0 days.

(21) Appl. No.: 16/143,434

(22) Filed: Sep. 26, 2018

(65) Prior Publication Data
US 2020/0028028 A1    Jan. 23, 2020

(30) Foreign Application Priority Data

Jul. 20, 2018 (TW) .............................. 107125053 A

(51) Int. Cl.
*H01L 33/20* (2010.01)
*H01L 25/075* (2006.01)
(Continued)

(52) U.S. Cl.
CPC .............. *H01L 33/20* (2013.01); *H01L 24/10* (2013.01); *H01L 25/0753* (2013.01);
(Continued)

(58) Field of Classification Search
None
See application file for complete search history.

(56) References Cited

U.S. PATENT DOCUMENTS

| 6,100,103 A * | 8/2000 | Shim .................. H01L 25/0756 |
| | | 438/26 |
| 2004/0206977 A1* | 10/2004 | Cho ...................... H01L 33/405 |
| | | 257/189 |

(Continued)

FOREIGN PATENT DOCUMENTS

| TW | 201351719 | 12/2013 |
| TW | 201605082 | 2/2016 |
| TW | 201804608 | 2/2018 |

OTHER PUBLICATIONS

"Office Action of Taiwan Counterpart Application", dated Jan. 15, 2019, p. 1-p. 6.

*Primary Examiner* — Anthony Ho
*Assistant Examiner* — Kevin Quinto
(74) *Attorney, Agent, or Firm* — JCIPRNET

(57) ABSTRACT

A micro light emitting device including a component layer, a first electrode and a second electrode is provided. The component layer includes a main body and a protruding structure disposed on the main body. The first electrode is electrically connected to the component layer. The second electrode is electrically connected to the component layer. The first electrode, the second electrode and the protruding structure are disposed on the same side of the main body. The protruding structure is located between the first electrode and the second electrode. A connection between the first electrode and the second electrode traverses the protruding structure. The main body has a surface. The protruding structure has a first height with respect to the surface. Any one of the first electrode and the second electrode has a second height with respect to the surface. The relation $0.8 \le H1/H2 \le 1.2$ is satisfied, wherein H1 is the first height and H2 is the second height. A display apparatus having a plurality of micro light emitting devices is provided as well.

18 Claims, 6 Drawing Sheets

(51) Int. Cl.
*H01L 33/38* (2010.01)
*H01L 33/62* (2010.01)
*H01L 33/44* (2010.01)
*H01L 23/00* (2006.01)
*H01L 33/32* (2010.01)
*H01L 33/06* (2010.01)

(52) U.S. Cl.
CPC ............ *H01L 33/382* (2013.01); *H01L 33/44* (2013.01); *H01L 33/62* (2013.01); *H01L 33/06* (2013.01); *H01L 33/32* (2013.01); *H01L 2224/10145* (2013.01)

(56) References Cited

U.S. PATENT DOCUMENTS

2006/0261350 A1* 11/2006 Kawazoe .............. H01L 33/025
257/79
2016/0020353 A1 1/2016 Chu
2018/0019233 A1* 1/2018 Chang ................. H01L 25/0753

* cited by examiner

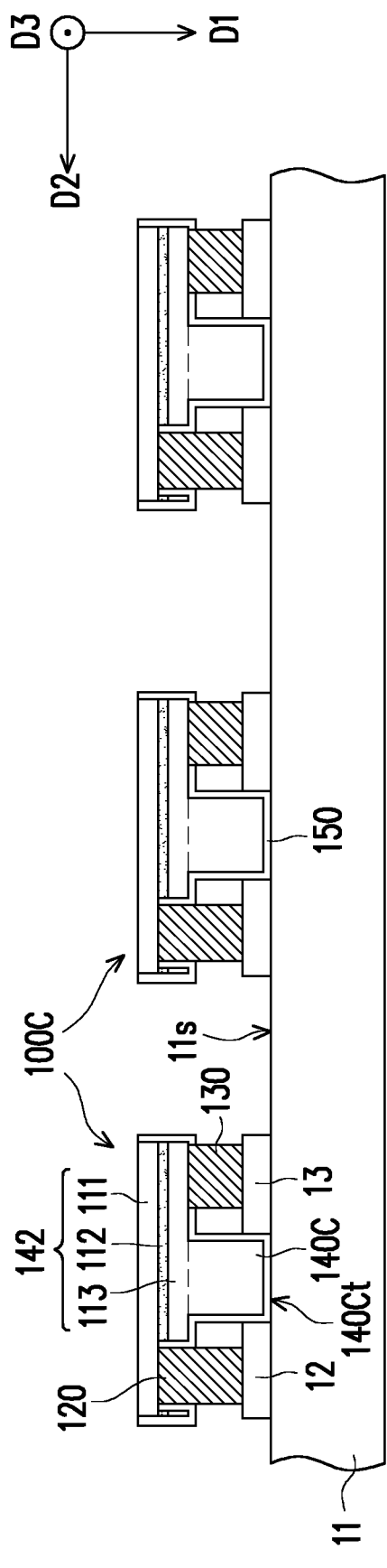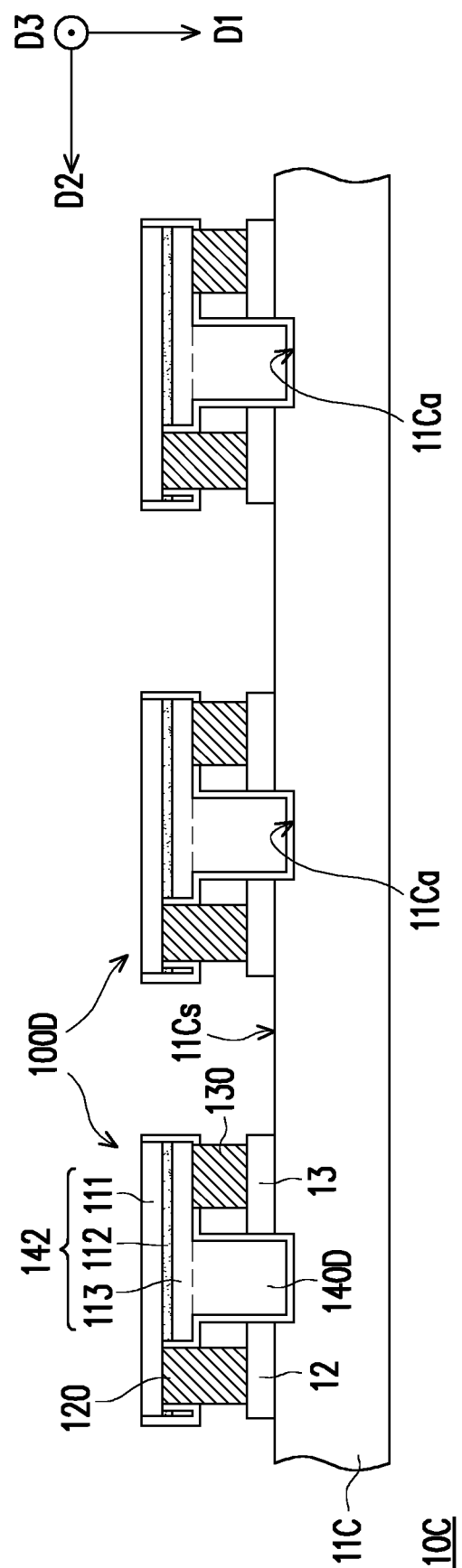

MICRO LIGHT EMITTING DEVICE AND DISPLAY APPARATUS

CROSS-REFERENCE TO RELATED APPLICATION

This application claims the priority benefit of Taiwan application serial no. 107125053, filed on Jul. 20, 2018. The entirety of the above-mentioned patent application is hereby incorporated by reference herein and made a part of this specification.

BACKGROUND OF THE INVENTION

Field of the Invention

The invention relates to a light emitting device and a display apparatus, and particularly relates to a micro light emitting device and a display apparatus.

Description of Related Art

With the progress in optoelectronic technology, traditional incandescent bulbs and fluorescent lamps have been gradually replaced by a new generation of solid-state light sources such as light-emitting diodes (LEDs). The LEDs have advantages such as long-life span, miniature size, high vibration and shock resistance, high light efficiency and low power consumption, and thus have already been widely used as light sources in household lighting and various equipments. In addition to the backlight module of the liquid crystal display (LCD) and the household lighting fixture that have widely adopted the LEDs as the light sources, in recent years, the application scope of the LED has been expanded to road lighting, large outdoor display boards, traffic signal lights, UV curing and other related fields. The LEDs have become one of the main projects for the development of power-saving and environmentally friendly light sources.

In the LED field, a new technology, which is called a micro light emitting diode (micro-LED), has been developed to reduce the size of the original LED chip. Compared with the existent organic light emitting diode display on the market, the micro-LED is expected to become the mainstream display technology in the next generation due to longer life span and lower production costs, and it thus have attracted active investment and development efforts of many manufacturers. However, the miniaturization of the LED also results in the shortening of the spacing between two electrode pads. Consequently, during the bonding process of transferring the micro light emitting device to the display apparatus, the problem of short circuit is easy to occur due to the overflowing of the conductive soldering materials respectively connected to the two electrode pads, thereby increasing the chances of producing defective products.

SUMMARY OF THE INVENTION

The invention provides a micro light emitting device with a good transferring success rate.

The invention provides a display apparatus with a good production yield.

According to the embodiments of the invention, a micro light emitting device including a component layer, a first electrode and a second electrode is provided. The component layer includes a main body and a protruding structure disposed on the main body. The main body has a surface. The first electrode is electrically connected to the component layer. The second electrode is electrically connected to the component layer. The first electrode, the second electrode and the protruding structure are disposed on the same side of the main body. The protruding structure is located between the first electrode and the second electrode, and a connection between the first electrode and the second electrode traverses the protruding structure. The protruding structure has a first height with respect to the surface. Any one of the first electrode and the second electrode has a second height with respect to the surface. The relation $0.8 \leq H1/H2 \leq 1.2$ is satisfied, wherein H1 is the first height and H2 is the second height.

According to the embodiments of the invention, a display apparatus including a back plate, a first bonding pad and a second bonding pad, and the aforementioned micro light emitting device is provided. The first bonding pad and the second bonding pad are disposed on the back plate. The first electrode of the micro light emitting device is electrically connected to the back plate through the first bonding pad. The second electrode of the micro light emitting device is electrically connected to the back plate through the second bonding pad. The first bonding pad and the second bonding pad are separated from each other.

In an embodiment of the invention, a maximum length of the protruding structure of the micro light emitting device is L1. A spacing between the first electrode and the second electrode is S1, and $0.8 \leq L1/S1 \leq 1$ is satisfied.

In an embodiment of the invention, a maximum length of the component layer of the micro light emitting device is L2, and $L1/L2 \leq 0.8$ is satisfied.

In an embodiment of the invention, the first height of the micro light emitting device is less than the second height, and $(H2-H1)/H1 \leq 0.2$ is satisfied.

In an embodiment of the invention, the first height of the micro light emitting device is greater than the second height, and $(H1-H2)/H1 \leq 0.2$ is satisfied.

In an embodiment of the invention, a thickness of the component layer of the micro light emitting device is H3, and $0.01 \leq H1/H3 \leq 0.95$ is satisfied.

In an embodiment of the invention, the component layer of the micro light emitting device has two side edges that are opposite to each other. A spacing between the two side edges is S2, a shortest spacing between the protruding structure and any one of the two side edges is S3, and $0.01 \leq S3/S2 \leq 0.2$ is satisfied.

In an embodiment of the invention, in the micro light emitting device, a ratio of an orthographic projection area of the protruding structure on the surface of the main body to a surface area of the surface of the main body is less than or equal to 0.8.

In an embodiment of the invention, the main body of the micro light emitting device includes a first type semiconductor layer, a light emitting layer and a second type semiconductor layer. The light emitting layer is disposed on the first type semiconductor layer. The second type semiconductor layer is disposed on the light emitting layer. The protruding structure is connected to the second type semiconductor layer.

In an embodiment of the invention, the component layer of the micro light emitting device includes a first type semiconductor layer, a light emitting layer and a second type semiconductor layer. The light emitting layer is disposed on the first type semiconductor layer. The second type semiconductor layer is disposed on the light emitting layer. The protruding structure includes at least a portion of the second type semiconductor layer.

In an embodiment of the invention, the protruding structure of the micro light emitting device includes the second type semiconductor layer, the light emitting layer and a portion of the first type semiconductor layer.

In an embodiment of the invention, the micro light emitting device further includes an insulating layer and a conductive layer. The insulating layer partially covers the first type semiconductor layer and the protruding structure. The conductive layer is disposed on the insulating layer, and is connected to a portion of the second type semiconductor layer exposed by the insulating layer in the protruding structure. The second electrode is connected to the conductive layer, and the first electrode is connected to the first type semiconductor layer.

In an embodiment of the invention, the first electrode and the second electrode of the micro light emitting device have different electrical properties.

In an embodiment of the invention, in the display apparatus, orthographic projections of the first bonding pad and the second bonding pad on the back plate each partially overlap an orthographic projection of the protruding structure on the back plate.

In an embodiment of the invention, in the display apparatus, orthographic projections of the first bonding pad, the second bonding pad and the protruding structure on the back plate are staggered from one another.

In an embodiment of the invention, in the display apparatus, a top surface of the protruding structure is aligned with a surface of the back plate.

In an embodiment of the invention, in the display apparatus, the back plate has a groove disposed between the corresponding first bonding pad and the corresponding second bonding pad. A portion of the protruding structure of the micro light emitting device is disposed in the groove of the back plate.

Based on the foregoing, in an embodiment of the invention, since the micro light emitting device and the display apparatus include the protruding structure disposed between the first electrode and the second electrode, during the bonding process of transferring the micro light emitting device to the display apparatus, the bonding pad connected to the first electrode and the bonding pad connected to the second electrode may be effectively prevented from being conducted with each other due to the overflowing issue. As a result, a better production yield of the display apparatus may be achieved, and a larger design margin of the micro light emitting device may be provided.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 6 is a cross-sectional view of a display apparatus according to another embodiment of the invention.

FIG. 7 is a cross-sectional view of a display apparatus according to yet another embodiment of the invention.

DESCRIPTION OF THE EMBODIMENTS

Figure 1:
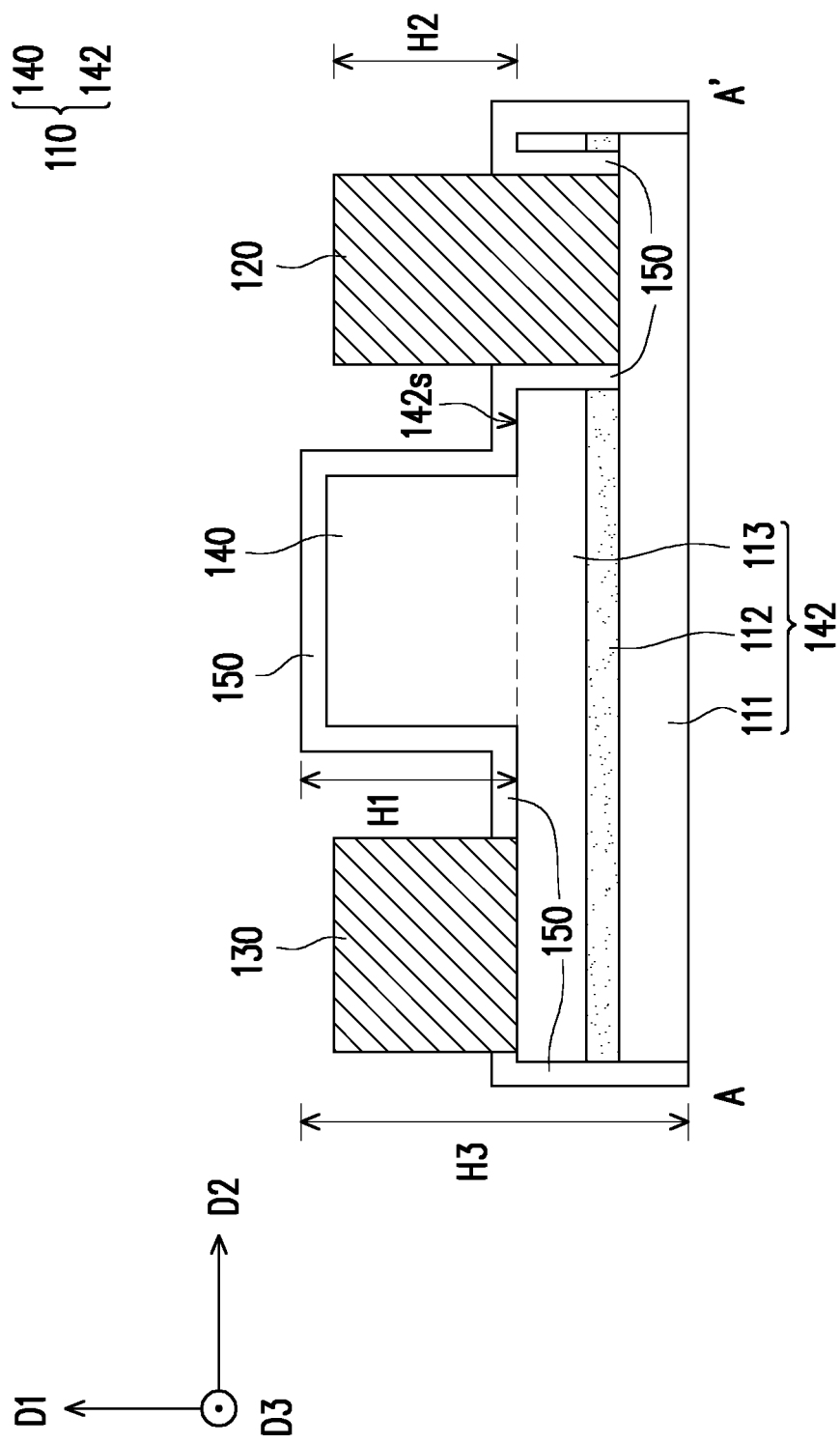
FIG. 1 is a schematic cross-sectional view of a micro light emitting device according to an embodiment of the invention.
Figure 2:
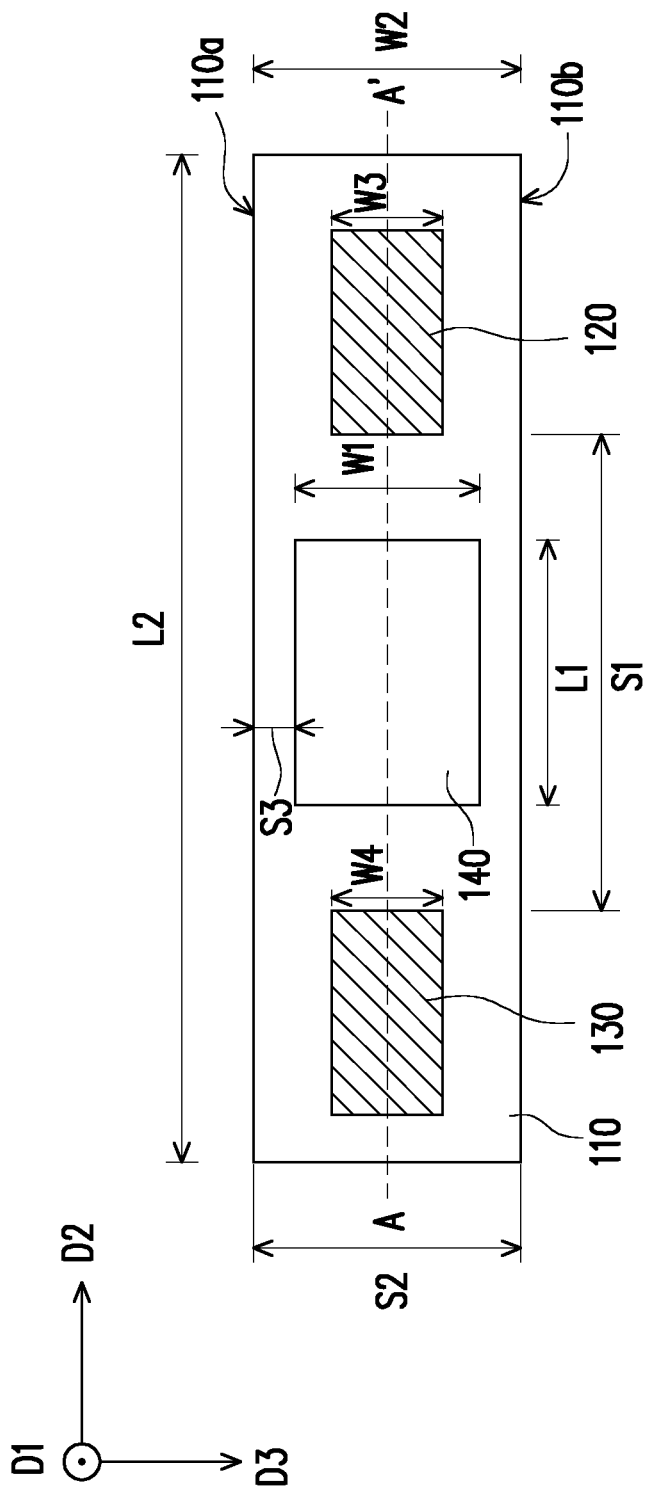
FIG. 2 is a schematic top view of a micro light emitting device according to an embodiment of the invention.

FIG. 1 is a schematic cross-sectional view of a micro light emitting device according to an embodiment of the invention. FIG. 2 is a schematic top view of a micro light emitting device according to an embodiment of the invention. FIG. 1 corresponds to a view taken along the line A-A' of FIG. 2. It should be particularly noted that FIG. 2 omits the insulating layer 150 of FIG. 1.

With reference to FIG. 1 and FIG. 2, in this embodiment, a micro light emitting device 100 includes a component layer 110, a first electrode 120 and a second electrode 130. The first electrode 120 is electrically connected to the component layer 110. The second electrode 130 is electrically connected to the component layer 110. The component layer 110 of the micro light emitting device 100 includes a protruding structure 140 and a main body 142. The protruding structure 140 is disposed between the first electrode 120 and the second electrode 130 and is disposed on the main body 142. The first electrode 120, the second electrode 130 and the protruding structure 140 are disposed on the same side of the component layer 110. More specifically, the first electrode 120, the second electrode 130 and the protruding structure 140 are disposed on the same side of the main body 142, and the orthographic projections of the first electrode 120, the second electrode 130 and the protruding structure 140 on a surface 142s of the main body 142 do not overlap. Particularly, in this embodiment, a connection between the first electrode 120 and the second electrode 130 traverses the protruding structure 140, wherein the connection is defined by any point on the first electrode 120 and any point on the second electrode 130. Furthermore, the orthographic projection of the connection on the surface 142s traverses the protruding structure 140. In other words, the orthographic projection of the connection on the surface 142s traverses the orthographic projection of the protruding structure 140 on the surface 142s.

In this embodiment, the protruding structure 140, the first electrode 120 and the second electrode 130 may be made of the same material, such as selected from gold (Au), tin (Sn), nickel (Ni), titanium (Ti), indium (In), an alloy of the foregoing materials, or a combination of the foregoing. However, the invention is not limited thereto. In other words, the protruding structure 140, the first electrode 120 and the second electrode 130 may be formed in the same film layer to avoid additional production costs. In other embodiments, the protruding structure 140 may also be made of a light transmitting material, such as silicon oxide, silicon nitride, silicon oxynitride, other suitable inorganic materials or a stacked layer of at least two of the foregoing materials, so as to avoid blocking the forward light emitted by the micro light emitting device 100.

In this embodiment, the main body 142 includes a first type semiconductor layer 111, a light emitting layer 112, and a second type semiconductor layer 113. The light emitting layer 112 is disposed on the first type semiconductor layer 111, and the second type semiconductor layer 113 is disposed on the light emitting layer 112. However, the invention is not limited thereto. For example, in this embodiment, the protruding structure 140 is connected to the second type semiconductor layer 113, but the invention is not limited thereto.

The first type semiconductor layer 111 and the second type semiconductor layer 113 may include a II-VI group material (e.g., ZnSe) or a III-V nitride material (e.g., GaN, AlN, InN, InGaN, AlGaN, or AlInGaN). In this embodiment, the first type semiconductor layer 111 is, for example, an N type doped semiconductor layer, and a material of the N type doped semiconductor layer is, for example, n-GaN. The second type semiconductor layer 113 is, for example, a P type doped semiconductor layer, and a material of the P type doped semiconductor layer is, for example, p-GaN. However, the invention is not limited thereto. In this embodiment, the structure of the light emitting layer 112 is, for example, a multilayer quantum well (MQW) structure, and the multiple quantum well structure includes a plurality of InGaN layers and a plurality of GaN layers that are alternately stacked. The luminescent wavelength range of the light emitting layer 112 may be adjusted through the design of the ratio of indium or gallium in the light emitting layer 112. However, the invention is not limited thereto.

In this embodiment, the first electrode 120 penetrates the second type semiconductor layer 113 and the light emitting layer 112 to be connected to the first type semiconductor layer 111, and the second electrode 130 is connected to the second type semiconductor layer 113. However, the invention is not limited thereto. According to other embodiments, the first electrode 120 and the second electrode 130 may be electrically connected to the first type semiconductor layer 111 and the second type semiconductor layer 113 through other conductive layers, respectively. Herein the first electrode 120 is, for example, an N type electrode, and the second electrode 130 is, for example, a P type electrode. More specifically, the first electrode 120 and the second electrode 130 have different electrical properties. In this embodiment, a material of the first electrode 120 and the second electrode 130 may be gold (Au), tin (Sn), nickel (Ni), titanium (Ti) and indium (In), an alloy of the foregoing materials, or a combination of the foregoing. However, the invention is not limited thereto.

With reference to FIG. 1, in this embodiment, the micro light emitting device 100 further includes an insulating layer 150 that covers the protruding structure 140, the light emitting layer 112, a portion of the first type semiconductor layer 111 and a portion of the second type semiconductor layer 113. The first electrode 120 penetrates the insulating layer 150, the second type semiconductor layer 113 and the light emitting layer 112 to be connected to the first type semiconductor layer 111. The second electrode 130 penetrates the insulating layer 150 to be connected to the second type semiconductor layer 113. It should be particularly noted that the portion of the insulating layer 150 that covers the protruding structure 140 may also be viewed as a part of the protruding structure 140. However, in an embodiment not shown here, the insulating layer 150 may also be omitted. In this embodiment, a material of the insulating layer 150 is, for example, silicon oxide, silicon nitride, silicon oxynitride, other suitable inorganic materials, or a stacked layer of at least two of the foregoing materials. However, the invention is not limited thereto.

In this embodiment, the protruding structure 140 is located on the surface 142s of the main body 142 in a first direction D1, and the vertical height of the protruding structure 140 with respect to the surface 142s is a first height H1. The vertical height of any one of the first electrode 120 and the second electrode 130 with respect to the surface 142s in the first direction D1 is a second height H2. For example, the first height H1 of the protruding structure 140 and the second height H2 of the first electrode 120 or the second electrode 130 may satisfy the following relation: $0.8 \leq H1/H2 \leq 1.2$. If the value is less than 0.8, the overflow issue in the bonding process may not be effectively avoided, and if the value is greater than 1.2, the yield of the bonding process may be lowered. The preferable implementation condition is $|H1-H2| \leq 1$ μm, under which the overflow issue in the bonding process may be effectively avoided and the yield of the bonding process may be increased, but the invention is not limited thereto. Specifically, the surface 142s of the main body 142 refers to the topmost surface of the main body 142. In some embodiments, the first height H1 of the protruding structure 140 is less than the second height H2 of any one of the first electrode 120 and the second electrode 130, and the following relation is satisfied: $(H2-H1)/H1 \leq 0.2$. If the value is greater than 0.2, the overflow issue in the bonding process may not be effectively avoided. In some other embodiments, the first height H1 of the protruding structure 140 is greater than the second height H2 of any one of the first electrode 120 and the second electrode 130, and the following relation is satisfied: $(H1-H2)/H1 \leq 0.2$. If the value is greater than 0.2, the yield of the bonding process may be affected.

In this embodiment, the component layer 110 has a thickness H3 in the first direction D1. For example, the first height H1 of the protruding structure 140 and the thickness H3 of the component layer 110 may satisfy the following relation: $0.01 \leq H1/H3 \leq 0.95$. If the value is less than 0.01, the overflow issue in the bonding process may not be effectively avoided, and if the value is greater than 0.95, the yield of the bonding process may be affected. The preferable implementation condition is $0.3 \leq H1/H3 \leq 0.7$, under which the overflow in the bonding process may be effectively blocked and the yield of the bonding process may be increased, but the invention is not limited thereto. With reference to FIG. 2, in this embodiment, the connection between the first electrode 120 and the second electrode 130 is substantially parallel to a second direction D2 (i.e., the extending direction of the line A-A'), and the second direction D2 is substantially perpendicular to the first direction D1. However, the invention is not limited thereto. In this embodiment, the protruding structure 140 has a maximum length L1 in the second direction D2, and a spacing S1 exists between the first electrode 120 and the second electrode 130 in the second direction D2. For example, the length L1 of the protruding structure 140 and the spacing S1 between the first electrode 120 and the second electrode 130 may satisfy the following relation: $0.8 \leq L1/S1 \leq 1$. If the value is less than 0.8, the overflow issue may not be effectively avoided, but the invention is not limited thereto.

In this embodiment, the component layer 110 has a maximum length L2 in the second direction D2. For example, in this embodiment, the length L1 of the protruding structure 140 and the length L2 of the component layer 110 may satisfy the following relation: $L1/L2 \leq 0.8$, so that the protruding structure 140 is prevented from getting too close to the edge of the main body 142 to cause a decrease in yield. However, the invention is not limited thereto. In this embodiment, the protruding structure 140 has a maximum width W1 in a third direction D3 perpendicular to the second direction D2, and the component layer 110 has a maximum width W2 in the third direction D3. For example, in this embodiment, the width W1 of the protruding structure 140 and the width W2 of the component layer 110 may satisfy the following relation: $W1/W2 \leq 0.8$, so that the protruding structure 140 is prevented from getting too close to the edge of the main body 142 to cause a decrease in yield. However, the invention is not limited thereto. It should be particularly noted that the first electrode 120 and the second electrode 130 respectively have a maximum width W3 and a maximum width W4 in the third direction D3 perpendicular to the second direction D2, wherein the width W1 is greater than both the width W3 and the width W4. As a result, a better overflow tolerance may be achieved.

In this embodiment, the component layer 110 has two side edges 110a and 110b that are opposite to each other, and a spacing between the two side edges 110a and 110b is S2. The shortest spacing between the protruding structure 140 and any one of the two, side edges 110a and 110b is S3. For example, in this embodiment, the spacing S2 between the two side edges 110a and 110b of the component layer 110 and the shortest spacing S3 between the protruding structure 140 and any one of the two side edges 110a and 110b may satisfy the following relation: $0.01 \leq S3/S2 \leq 0.2$, so that the protruding structure 140 is prevented from getting too close to the two side edges 110a and 110b of the component layer 110 to cause problems such as sidewall leakage. However, the invention is not limited thereto. Particularly, in some preferable embodiments, the shortest spacing S3 between the protruding structure 140 and any one of the two side edges 110a and 110b may be less than or equal to 10 µm.

In this embodiment, the ratio of the orthographic projection area of the protruding structure 140 on the surface 142s of the main body 142 to the surface area of the surface 142s of the main body 142 may be less than or equal to 0.8. If the value is greater than 0.8, the proportion of the protruding structure 140 is too large and the overflow tolerance is thus reduced. However, the invention is not limited thereto. Although some embodiments of the invention specifically describe a micro light emitting device having a P—N diode, it should be understood that the embodiments of the invention are not limited thereto. Other micro semiconductor devices are also applicable in some of the embodiments, including micro semiconductor devices that may control the execution of predetermined electronic functions (e.g., diodes, transistors, or integrated circuits) or micro semiconductor devices having photon functions (e.g., light-emitting diodes, laser diodes, or photodiodes). A microchip including circuits may also be applicable in other embodiments of the invention, e.g., a microchip made of a Si or SOI wafer material for logic or memory applications, or a microchip made of a GaAs wafer material for RF communication applications.

Figure 3:
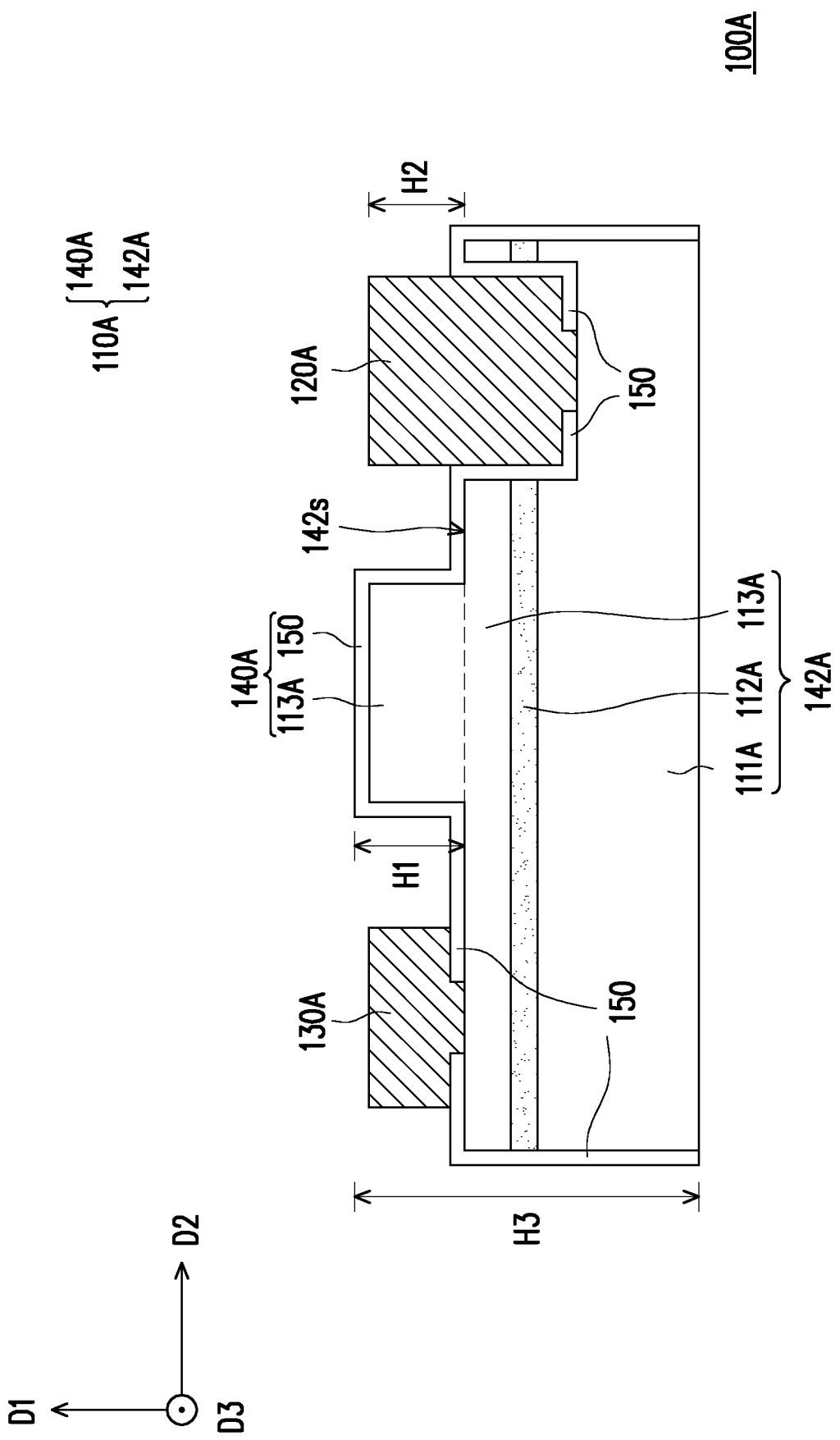
FIG. 3 is a schematic cross-sectional view of a micro light emitting device according to another embodiment of the invention.

FIG. 3 is a schematic cross-sectional view of a micro light emitting device according to another embodiment of the invention. With reference to FIG. 3, the main difference between a micro light emitting device 100A in this embodiment and the micro light emitting device 100 as shown in FIG. 1 is as follows: a protruding structure 140A of the micro light emitting device 100A includes at least a portion of a second type semiconductor layer 113A.

In this embodiment, a first electrode 120A penetrates the second type semiconductor layer 113A and a light emitting layer 112A of a main body 142A so as to be electrically connected to a portion of a first type semiconductor layer 111A exposed by an insulating layer 150. A second electrode 130A is connected to a portion of the second type semiconductor layer 113A exposed by the insulating layer 150. However, the invention is not limited thereto. In this embodiment, a first height H1 of the protruding structure 140A and a thickness H3 of a component layer 110A satisfy the following relation: $0.01 \leq H1/H3 \leq 0.3$, so that the overflow in the bonding process may be effectively blocked and the yield of the bonding process may be increased.

Figure 4:
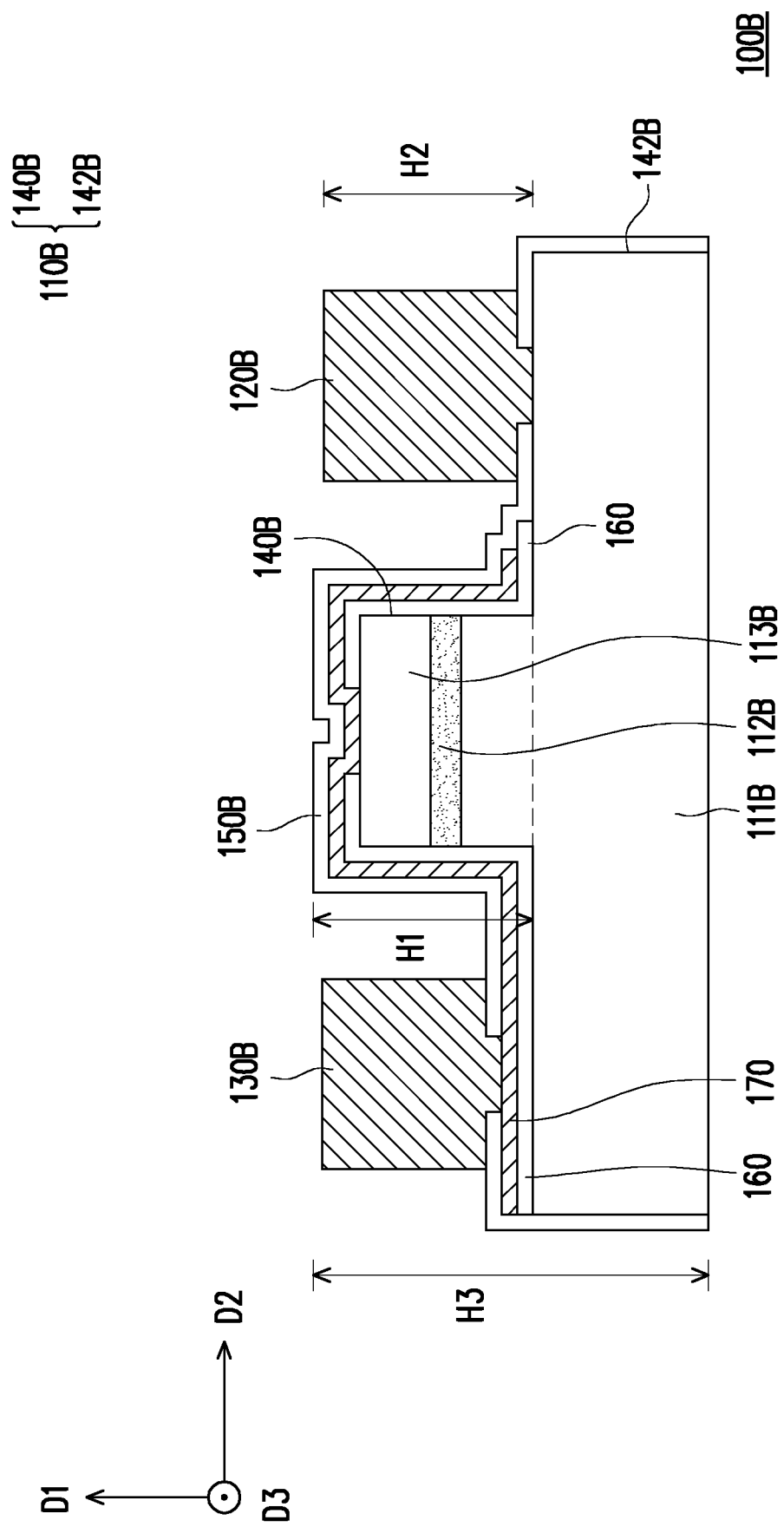
FIG. 4 is a schematic cross-sectional view of a micro light emitting device according to yet another embodiment of the invention.

FIG. 4 is a schematic cross-sectional view of a micro light emitting device according to yet another embodiment of the invention. With reference to FIG. 4, the main difference between a micro light emitting device 100B in this embodiment and the micro light emitting device 100 as shown in FIG. 1 is as follows: a protruding structure 140B of the micro light emitting device 100B includes a second type semiconductor layer 113B and a light emitting layer 112B. For example, in this embodiment, the protruding structure 140B further includes a portion of a first type semiconductor layer 111B, and a main body 142B includes a portion of the first type semiconductor layer 111B. However, the invention is not limited thereto. In this embodiment, the light emitting layer 112B is located in the protruding structure 140B at the center, and a first electrode 120B and a second electrode 130B are disposed on two sides of the protruding structure 140B. Therefore, the current density of the micro light emitting device 100B is concentrated to enhance the light emitting efficiency of the micro light emitting device 100B and to avoid problems such as sidewall leakage.

It should be particularly noted that the protruding structure 140B and the main body 142B in this embodiment may be chosen to be formed from the same process; for example, both may be formed through metal-organic chemical vapor deposition. More preferably, after the first type semiconductor layer 111B, the light emitting layer 112B and the second type semiconductor layer 113B are completed, the protruding structure 140B and the main body 142B are then respectively formed by processes such as photolithographic and etching processes to improve the manufacturing efficiency of the micro light emitting device 100B. However, the invention is not limited thereto. In this embodiment, a first height H1 of the protruding structure 140B and a thickness H3 of a component layer 110B satisfy the following relation: $0.7 \leq H1/H3 \leq 0.95$. If the value is less than 0.7, the overflow issue in the bonding process may not be effectively avoided, and if the value is greater than 0.95, the yield of the bonding process may be affected.

In this embodiment, the first electrode 120B and the second electrode 130B are disposed on the first type semiconductor layer 111B. The micro light emitting device 100B further includes an insulating layer 160 and a conductive layer 170. The insulating layer 160 partially covers the first type semiconductor layer 111B and the protruding structure 140B. The conductive layer 170 is disposed on the insulating layer 160, and is connected to a portion of the second type semiconductor layer 113B exposed by the insulating layer 160 in the protruding structure 140B. For example, the second electrode 130B is electrically connected to the second type semiconductor layer 113B through the conductive layer 170, and the first electrode 120B is connected to a portion of the first type semiconductor layer 111B exposed by an insulating layer 150B. However, the invention is not limited thereto. In this embodiment, the insulating layer 160 and the insulating layer 150B may be made of the same material, such as silicon oxide, silicon nitride, silicon oxynitride, other suitable inorganic materials, or a stacked layer of at least two of the foregoing materials. However, the invention is not limited thereto. It should be particularly noted that the portions of the insulating layer 150B, the insulating layer 160 and the conductive layer 170 that cover the protruding structure 140B may also be viewed as a part of the protruding structure 140B.

In this embodiment, considering electrical conductivity, the conductive layer 170 is generally made of a metal material. However, the invention is not limited thereto. In some embodiments, the conductive layer 170 may also be made of another conductive material, such as an alloy, a nitride of the metal material, an oxide of the metal material, a nitrogen oxide of the metal material, other suitable materials, or a stacked layer of the metal material and other conductive materials. In some other embodiments, the conductive layer 170 may also be made of a conductive material having high reflectivity, such as silver (Ag), aluminum (Al) or gold (Au), to improve the effective light emitting intensity of the micro light emitting device 100B.

Figure 5A:
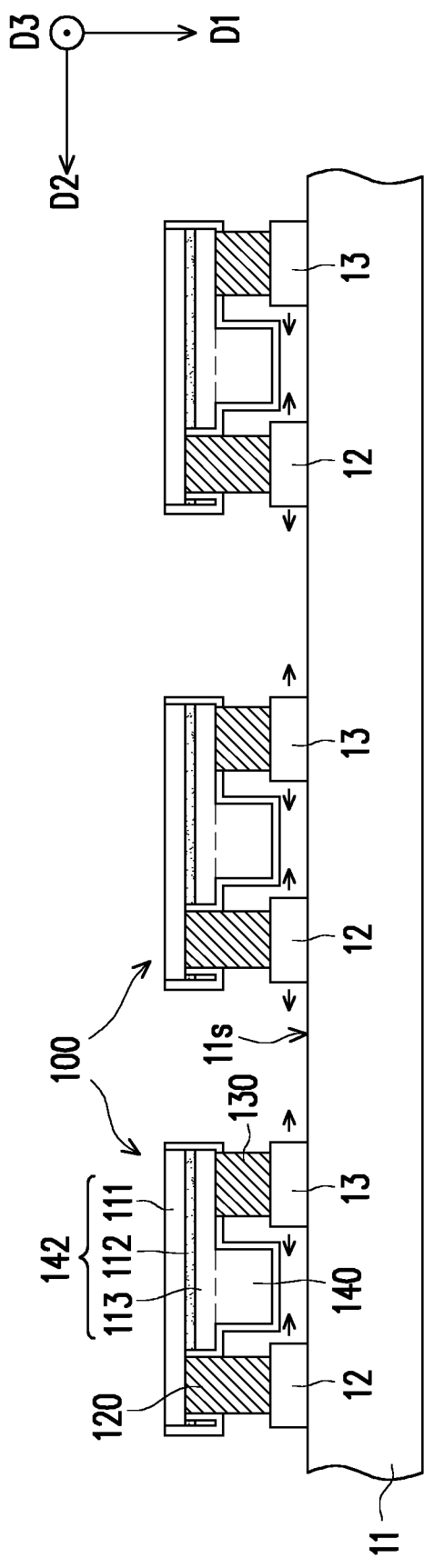
FIG. 5A to FIG. 5B are schematic cross-sectional views showing a bonding process of a display apparatus according to an embodiment of the invention.
Figure 5B:
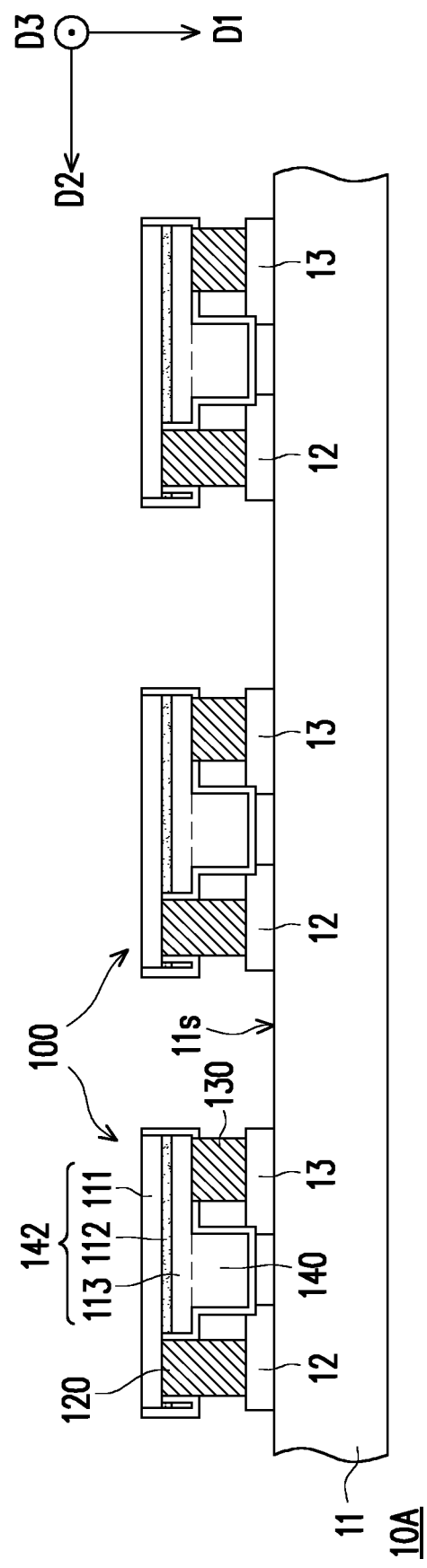

FIG. 5A to FIG. 5B are schematic cross-sectional views showing a bonding process of a display apparatus 10A according to an embodiment of the invention. FIG. 5A is a schematic cross-sectional view showing a plurality of micro light emitting devices 100 transferring onto a back plate 11. With reference to FIG. 5A, in this embodiment, the display apparatus 10A includes the plurality of micro light emitting devices 100, the back plate 11, a plurality of first bonding pads 12 and a plurality of second bonding pads 13. The plurality of first bonding pads 12 are respectively disposed on the back plate 11 corresponding to first electrodes 120 of the plurality of micro light emitting devices 100. The plurality of second bonding pads 13 are respectively disposed on the back plate 11 corresponding to second electrodes 130 of the plurality of micro light emitting devices 100. In this embodiment, a material of the first bonding pad 12 and the second bonding pad 13 is, for example, gold, copper, tin, indium, an alloy of the foregoing materials, a combination of the foregoing materials, or a solder paste. However, the invention is not limited thereto. According to other embodiments, the bonding pad 12 and the second bonding pad 13 may also be made of an anisotropic conductive film (ACF) or other suitable bonding materials.

FIG. 5B is a schematic cross-sectional view showing the display apparatus 10A in this embodiment after the plurality of first bonding pads 12 and the plurality of second bonding pads 13 are heated and cured. With reference to FIG. 5B, after the plurality of first bonding pads 12 and the plurality of second bonding pads 13 in FIG. 5A are heated to a melted state, the plurality of first bonding pads 12 and the plurality of second bonding pads 13 in the melted state each overflow along a surface 11s of the back plate 11. Herein the first bonding pad 12 and the second bonding pad 13 flowing toward a protruding structure 140 overflow between the protruding structure 140 and the back plate 11. Particularly, in this embodiment, the first bonding pad 12 and the second bonding pad 13 overflowing between the protruding structure 140 and the back plate 11 are not in contact with each other. That is to say, the protruding structure 140 in this embodiment may greatly reduce the probability of causing short circuit due to the overflowing of the first bonding pad 12 and the second bonding pad 13 in the melted state.

After the first bonding pad 12 and the second bonding pad 13 are cooled and cured, the first electrode 120 of the micro light emitting device 100 is electrically connected to the back plate 11 through the first bonding pad 12, and the second electrode 130 of the micro light emitting device 100 is electrically connected to the back plate 11 through the second bonding pad 13, so that the display apparatus 10A of this embodiment is formed. In this embodiment, the orthographic projections of the first bonding pad 12 and the second bonding pad 13 on the back plate 11 each partially overlap the orthographic projection of the protruding structure 140 on the back plate 11. However, the invention is not limited thereto. In some embodiments, the orthographic projections of the first bonding pad 12, the second bonding pad 13 and the protruding structure 140 on the back plate 11 are staggered from one another.

Specifically, in this embodiment, the display apparatus 10A is, for example, a micro-LED display. The micro-LED display may include other components depending on its application. The other components include (but are not limited to) memory, a touch screen controller and a battery. In other embodiments, the micro-LED display may be a television, a tablet computer, a telephone, a laptop computer, a computer monitor, a stand-alone terminal service desk, a digital camera, a handheld game console, a media display, an e-book display, a vehicle display, or a large electronic bulletin board display. Besides, compared with general LED technology, the micro light emitting device is reduced from the millimeter-scale to the micrometer-scale. As a result, the micro-LED display may achieve high resolution and reduce power consumption of the display, and has advantages such as energy saving, simple mechanism, and thinness in shape.

In this embodiment, the back plate 11 is, for example, a pixel array substrate. The pixel array substrate may be a complementary metal oxide semiconductor (CMOS) substrate, a liquid crystal on silicon (LCOS) substrate, a thin film transistor (TFT) substrate, or another substrate having a driving circuit. The plurality of micro light emitting devices 100 may include micro-LEDs having different luminescent wavelength ranges (e.g., red light, blue light, and green light). However, the invention is not limited thereto.

In this embodiment, the orthographic projection of the protruding structure 140 of the micro light emitting device 100 on the surface 11s of the back plate 11 has a rectangular contour. However, the invention is not limited thereto. According to other embodiments, the orthographic projection of the protruding structure 140 of the micro light emitting device 100 on the surface 11s of the back plate 11 may also have a square contour, a circular contour, a diamond-shaped contour or have a contour of another suitable shape. The following should be noted here: in some embodiments, the orthographic projections of the protruding structures 140 of the plurality of micro light emitting devices 100 applied to a display apparatus (such as a micro-LED display) on the surface 11s of the back plate 11 may have different contour shapes according to different luminescent wavelength ranges. In this way, during the process of transferring the plurality of micro light emitting devices to the back plate (such as a pixel array substrate), the protruding structures 140 having different appearances may improve the alignment accuracy of different pixels.

FIG. 6 is a cross-sectional view of a display apparatus according to another embodiment of the invention. With reference to FIG. 6, a difference between a display apparatus 10B of this embodiment and the display apparatus 10A of FIG. 5B is as follows: a top surface 140Ct of a protruding structure 140C of a micro light emitting device 100C is aligned with a surface 11s of a back plate 11. Therefore, during the bonding process, a first bonding pad 12 and a second bonding pad 13 in a melted state may be completely blocked by the protruding structure 140C of the micro light emitting device 100C, so that the probability of causing short circuit due to the overflowing of the first bonding pad 12 and the second bonding pad 13 in the melted state may be greatly reduced. It should be particularly noted that the protruding structure 140C here includes an insulating layer 150. However, the insulating layer 150 may also be omitted. As long as the first bonding pad 12 and the second bonding pad 13 in the melted state are blocked, the description is still within the scope of the invention.

FIG. 7 is a cross-sectional view of a display apparatus 10C according to yet another embodiment of the invention. With reference to FIG. 7, a difference between the display apparatus 10C of this embodiment and the display apparatus 10B of FIG. 6 is as follows: a back plate 11C has a plurality of grooves 11Ca, and each groove 11Ca is disposed between a set of a first bonding pad 12 and a second bonding pad 13 corresponding to one micro light emitting device 100D. In this embodiment, a portion of a protruding structure 140D of the micro light emitting device 100D is disposed in the groove 11Ca of the back plate 11C. Therefore, compared with the display apparatus 10B of FIG. 6, the display apparatus 10C of this embodiment may further reduce the probability of causing short circuit due to the overflowing of the first bonding pad 12 and the second bonding pad 13 in the melted state.

The following should be particularly noted here: in this embodiment, the orthographic projection of the groove 11Ca of the back plate 11C on a surface 11Cs of the back plate 11C has a rectangular contour, for example. However, the invention is not limited thereto. In some embodiments, the orthographic projection of the groove 11Ca of the back plate 11C on the surface 11Cs of the back plate 11C may also have a square contour, a circular contour, a diamond-shaped contour or have a contour of another suitable shape, so as to match the orthographic projection of the micro light emitting device 100D on the surface 11Cs of the back plate 11C. In other words, a plurality of micro light emitting devices 100D (such as micro-LEDs emitting lights of different colors) applied to a display apparatus (such as a micro-LED display) may perform an alignment process by utilizing the projection contour of the groove 11Ca of the back plate 11C on the surface 11Cs, so as to improve the alignment accuracy of different pixels.

In summary, in the embodiments of the invention, since the micro light emitting device and the display apparatus include the protruding structure disposed between the first electrode and the second electrode, during the bonding process of transferring the micro light emitting device to the display apparatus, the bonding pad connected to the first electrode and the bonding pad connected to the second electrode may be effectively prevented from being conducted with each other due to the overflowing issue. As a result, a better production yield of the display apparatus may be achieved, and a larger design margin of the micro light emitting device may be provided.

Although the embodiments are already disclosed as above, these embodiments should not be construed as limitations on the scope of the invention. It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A micro light emitting device, comprising:
   a component layer comprising a main body and a protruding structure disposed on the main body, wherein the main body has a surface;
   a first electrode electrically connected to the component layer; and
   a second electrode electrically connected to the component layer, wherein the first electrode, the protruding structure and the second electrode are disposed on the same side of the main body, wherein the protruding structure is located between the first electrode and the second electrode, the first electrode and the second electrode are respectively disposed at two opposite sides of the protruding structure, and the first electrode and the second electrode have different electrical properties,
   wherein the protruding structure has a first height with respect to the surface, any one of the first electrode and the second electrode has a second height with respect to the surface, and $0.8 \leq H1/H2 \leq 1.2$ is satisfied, wherein H1 is the first height and H2 is the second height,
   wherein a maximum length of the protruding structure is L1, a spacing between the first electrode and the second electrode is S1, and $0.8 \leq L1/S1 \leq 1$ is satisfied.

2. The micro light emitting device as recited in claim 1, wherein a maximum length of the component layer is L2, and $L1/L2 \leq 0.8$ is satisfied.

3. The micro light emitting device as recited in claim 1, wherein the first height is less than the second height, and $(H2-H1)/H1 \leq 0.2$ is satisfied.

4. The micro light emitting device as recited in claim 1, wherein the first height is greater than the second height, and $(H1-H2)/H1 \leq 0.2$ is satisfied.

5. The micro light emitting device as recited in claim 1, wherein a thickness of the component layer is H3, and $0.01 \leq H1/H3 \leq 0.95$ is satisfied.

6. The micro light emitting device as recited in claim 1, wherein the component layer has two side edges that are opposite to each other, wherein a spacing between the two side edges is S2, a shortest spacing between the protruding structure and any one of the two side edges is S3, and $0.01 \leq S3/S2 \leq 0.2$ is satisfied.

7. The micro light emitting device as recited in claim 1, wherein a ratio of an orthographic projection area of the protruding structure on the surface of the main body to a surface area of the surface of the main body is less than or equal to 0.8.

8. The micro light emitting device as recited in claim 1, wherein the main body comprises:
   a first type semiconductor layer;
   a light emitting layer disposed on the first type semiconductor layer; and
   a second type semiconductor layer disposed on the light emitting layer, wherein the protruding structure is connected to the second type semiconductor layer.

9. The micro light emitting device as recited in claim 1, wherein orthographic projections of the first electrode, the second electrode and the protruding structure on the main body do not overlap.

10. The micro light emitting device as recited in claim 1, wherein the component layer comprises:
    a first type semiconductor layer;
    a light emitting layer disposed on the first type semiconductor layer; and
    a second type semiconductor layer disposed on the light emitting layer, wherein the protruding structure comprises at least a portion of the second type semiconductor layer.

11. The micro light emitting device as recited in claim 10, wherein the protruding structure comprises the second type semiconductor layer, the light emitting layer and a portion of the first type semiconductor layer.

12. The micro light emitting device as recited in claim 11, further comprising:
   an insulating layer partially covering the first type semiconductor layer and the protruding structure; and
   a conductive layer disposed on the insulating layer, wherein the conductive layer is connected to a portion of the second type semiconductor layer exposed by the insulating layer in the protruding structure,
   wherein the second electrode is connected to the conductive layer, and the first electrode is connected to the first type semiconductor layer.

13. The micro light emitting device as recited in claim 12, wherein the conductive layer comprises a conductive material having high reflectivity, and the conductive material comprises silver, aluminum or gold.

14. A display apparatus, comprising:
   a plurality of micro light emitting devices, each of the micro light emitting devices comprising:
      a component layer comprising a main body and a protruding structure disposed on the main body, wherein the main body has a surface;
      a first electrode electrically connected to the component layer; and
      a second electrode electrically connected to the component layer;
      wherein the first electrode, the protruding structure and the second electrode are disposed on the same side of the main body, wherein the protruding structure is located between the first electrode and the second electrode, the first electrode and the second electrode are respectively disposed at two opposite sides of the protruding structure, and the first electrode and the second electrode have different electrical properties, wherein the protruding structure is perpendicular to the surface and has a first height, any one of the first electrode and the second electrode is perpendicular to the surface and has a second height, and $0.8 \leq H1/H2 \leq 1.2$ is satisfied, wherein H1 is the first height and H2 is the second height;
   a back plate; and
   a first bonding pad and a second bonding pad disposed on the back plate,
   wherein the first electrode of each of the plurality of micro light emitting devices is electrically connected to the back plate through the first bonding pad, and the second electrode of each of the plurality of micro light emitting devices is electrically connected to the back plate through the second bonding pad, and the first bonding pad and the second bonding pad are separated from each other,
   wherein a maximum length of the protruding structure is L1, a spacing between the first electrode and the second electrode is S1, and $0.8 \leq L1/S1 \leq 1$ is satisfied.

15. The display apparatus as recited in claim 14, wherein orthographic projections of the first bonding pad and the second bonding pad on the back plate each partially overlap an orthographic projection of the protruding structure on the back plate.

16. The display apparatus as recited in claim 14, wherein the back plate has a groove disposed between the corresponding first bonding pad and the corresponding second bonding pad, and a portion of the protruding structure of each of the plurality of micro light emitting devices is disposed in the groove of the back plate.

17. The display apparatus as recited in claim 14, wherein orthographic projections of the first bonding pad, the second bonding pad and the protruding structure on the back plate are staggered from one another.

18. The display apparatus as recited in claim 17, wherein a top surface of the protruding structure is aligned with a surface of the back plate.

* * * * *